(12) United States Patent
Gventer (10) Patent No.: US 6,563,301 B2
(45) Date of Patent: May 13, 2003

(54) ADVANCED PRODUCTION TEST METHOD AND APPARATUS FOR TESTING ELECTRONIC DEVICES

(75) Inventor: Brian Gventer, Fort Worth, TX (US)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/845,912

(22) Filed: Apr. 30, 2001

(65) Prior Publication Data

US 2002/0160768 A1 Oct. 31, 2002

(51) Int. Cl.[7] ............................................... G01R 31/02
(52) U.S. Cl. ..................... 324/158.1; 324/753; 324/752
(58) Field of Search .............................. 324/158.1, 754, 324/753; 250/211.1, 206; 198/339.1; 209/573, 572, 571; 455/67.1, 115, 226.1

(56) References Cited

U.S. PATENT DOCUMENTS

| | | | | |
|---|---|---|---|---|
| 5,193,685 A | * | 3/1993 | Trevithick | ................ 324/158.1 |
| 5,828,223 A | * | 10/1998 | Rabkin et al. | ............... 324/754 |
| 5,945,835 A | * | 8/1999 | McDonough et al. | ........ 324/754 |
| 6,111,246 A | * | 8/2000 | Watanabe et al. | ........ 324/158.1 |
| 6,356,094 B1 | * | 3/2002 | Tverdy et al. | ............... 324/758 |

* cited by examiner

Primary Examiner—Kamand Cuneo
Assistant Examiner—Jimmy Nguyen
(74) Attorney, Agent, or Firm—Steven A. Shaw (57) ABSTRACT

An advanced process for moving a Device under Test (DUT) from surface mount to completion and shipping. The process takes a raw populated Printed Circuit Board (PCB) panel or similar article of manufacture and conducts all possible solder, electrical, boundary scan and flashed self-testing. Individual panels are routed out of larger panels and placed into basic electronic device chassis on a motorized and power delivering fixture carrying a fixture adapter to interface with the electronic device. Power is provided as soon as is feasible in order to leverage the DUTs ability to facilitate it's own functional certification. Without power, the "wake-up" time for an electronic device may be extensive. Additionally, the addition of power would otherwise have to be done numerous times throughout the process. Conditions for impending measurement can be set up on a powered electronic device so that measurements may be made the moment the testing instrumentation is ready to take measurements.

13 Claims, 4 Drawing Sheets

ADVANCED PRODUCTION TEST METHOD AND APPARATUS FOR TESTING ELECTRONIC DEVICES

BACKGROUND

The present invention relates generally to testing of electronic devices. More particularly, the present invention relates to a cellular Radio Frequency (RF) mobile station production/testing and statistical monitoring process.

Prior art production methodology relied on centralized testers doing long arduous test plans and catching process problems long after they occurred. The testers were then considered suspect until proven innocent at which point the actual proximate cause could be investigated and corrected. Often after significant numbers of unsound and unreliable product were built, and subsequently a massive rework effort ensued. This results in wasted product, money, and resources.

Prior art test/production methodology uses an aging, centralized process with very expensive Automated Test Equipment (ATE) and fixture equipment. ATE is a chassis populated with instruments, controlled by a computer, which controls various measurements and tests on a Device Under Test (DUT), and records results fixture equipment. Because the testing is centralized in RF shielded fixtures, (essentially miniature RF chambers), expensive manipulation systems or more expensive and less reliable human operators are required to pick and place DUTs into testers. Valuable time is wasted as the DUT is drawn into the fixture, interfaces are engaged, and power is applied to the DUT. With some electronic devices such as mobile stations, there is a latency or delay between the application of power and when the device is ready or "awake." When the DUT is finally "awake" the DUT must be placed in the conditions for the test. Finally, a given ATE instrument may perform an action upon the DUT and then sit idle while all other measurements and actions are performed. Once all actions are complete, the DUT is disengaged, extracted, picked and placed back to the conveyor, and sent to the next stage of production. Actual idle time by the ATE instruments may be around 80%. ATE equipment is expensive with average costs in the six figure range. Therefore, it is desirable to reduce idle time and increase the productivity of any ATE.

Prior art processes require automated testing of displays and user interfaces of the DUT in the tester by key press robots. A key press robot is usually contained inside a final user interface test fixture and is used for mechanically interfacing a device under test. The key press robot is RF shielded and is a "drawer-like slide mechanism with a fixture adapter mounted on it. The fixture adapter is specific for the device. The adapter clamps, grabs, or secures the device depending on the type of fixture and the specific attachment surfaces of the device. The adapter also interfaces ear phone jacks, power, etc., and the slide is drawn into the fixture pneumatically.

Once inside the fixture, the device is run through a series of functions and responses are measured to ensure it falls within acceptable limits. In an example of an embodiment of the present invention, a mobile station is the electronic device. A display test is run measured with a sophisticated vision system to ensure all the LEDs, display patterns, keypad backlights etc are functionally sound and reliable. Audio tests measure the speakers and microphones. The phone is brought up into a call and it's transmitter/receiver tuning and power accuracy is measured. A pneumatic robot finger presses each key and ensures that every one functions, does not jam, and the like. Because it's pneumatic it's relatively slow.

The speed of a key press robot becomes the bottleneck. There is a delay caused by power-up of the Device Under Test (DUT) and the pneumatic fingers. Testing at the point of assembly allows better process verification, and places responsibility with the process or vendor quality.

Production and testing systems are monitored by an experienced human. A human supervising the process with undivided attention is still unable to effectively monitor and identify a yield-threatening trend. The intricacy and range of data managed by a single tester in production is currently difficult for less than experienced engineers. The ability for many individuals to further understand and correlate the measurement values and hidden inter-relationships is exponentially complex when stages of 10 testers are aggregated, compounded yet again by correlating inter-relationships between test stages.

In the cellular handset production arena, the current production/test methodology to produce cellular handsets will require a 400% increase in current test equipment, manpower, and floor space.

Earlier production methodology relied on centralized testers doing long arduous test plans, and catching process problems long after they occurred. The testers were then considered suspect until proven innocent at which point the actual proximate cause could be investigated and corrected. Often after significant numbers of unsound and unreliable product was built, and subsequently a massive rework effort ensued. Testers are often relied upon to "test" quality into the system. There is a need to verify processes at the point of operation, and identify problems early.

Prior to the advent of the present invention, monitoring consisted of technicians and supervisors standing in front of a monitor flipping through displays. If experienced, they can identify trends as they became statistically significant. Often that effort is investigative, only drawing attention after the problem becomes significant. Even experienced monitors may have problems monitoring multiple testers with their exponentially increasing complexity as stated above. Other methods for monitoring included exhaustive Statistical Process Control (SPC) tools which required highly trained and competent engineers targeting specific points of data not close to real-time.

It is in light of this background information related to the production and testing of electronic devices that the significant improvement of the present invention has evolved.

SUMMARY

Embodiments of the present invention, accordingly, advantageously provide a cellular RF handset production/testing and statistical monitoring process.

Provided is an advanced process for moving a Device under Test (DUT) from surface mount to completion and shipping. The process takes a raw populated Printed Circuit Board (PCB) panel or similar article of manufacture and conducts all possible solder, electrical, boundary scan and flashed self-testing.

Individual panels are routed out of larger panels and placed into basic electronic device chassis on a motorized and power delivering fixture carrying a fixture adapter to interface with the electronic device. Power is provided as soon as is feasible in order to leverage the DUTs ability to facilitate it's own functional certification. Without power, the "wake-up" time for an electronic device may be extensive. For example, the wake-up time for a mobile station is 5 to 15 seconds. Additionally, the addition of power would otherwise have to be done numerous times throughout the process. Conditions for impending measurement can be set up on a powered electronic device so that measurements may be made the moment the testing instrumentation is ready to take measurements.

The DUT is interfaced and carried by a fixture adapter modified to mate the specific model DUT. The fixture adapter is mounted aboard a fixture, which serves as vehicular, power source, and communication suite for the adapter. The individual fixture has an addressable code. This code may be an internet address or the like. The code may also be analogous in form and function to a phone number. Using RF communication, the fixtures report to and are directed by a master control system which tracks progress and measurement results through each stage of assembly.

Various required measurements, tests, and software instructions are conducted wirelessly in a distributed fashion while the DUT advances through the process. Wireless methods, for example, include Radio Frequency Identification (RFID) BLUETOOTH, and cellular RF out of phase with production. Other distributed tests include image capture verification of component placement within tolerance windows, electrical contact presence and alignments, and display activation. Assembly and component verification is tested at or following the point of assembly wherever possible. All occur while the DUT continues to advance. Speed of the DUT may be regulated to allow a test completion or to "catch-up" within the process.

Where actual Baseband, RF, and transmitter power tuning/measuring are required, the DUT enters an RF shielded cell with robotic arms which "jack" into moving fixture adapters.

DUT physically moves on its dedicated fixture/fixture adapter during the production process with a goal of never halting until either packed for shipping or out of the process as a failure. Once all standards are met, the DUT is certified. The handset routes to an off-loading, labeling and packaging cell.

Overall measurement results are monitored by an Artificial Intelligence (AI) system in near real-time. Yield and process trend patterns are identified/reacted to according to established rule-sets governing process situations and/or notification of human authorities.

An aspect of an embodiment of the present invention, tests are distributed, actual centralized test time is limited to absolute minimum and all instruments are efficiently utilized. Because the test time and utilization rate is so much higher, fewer ATE are required.

Another object of an embodiment of the invention provides for reduced size ATEs (e.g. from 1.6 meters tall and 800 lbs., to the size of a suitcase and portable).

An further object of an embodiment of the invention provides a quick cycle time in production.

A still further object of an embodiment of the invention is speed. PXI interface is 100 times faster than current General Purpose Interface Bus (GPIB) interface.

Additionally, PXI instruments don't have to be pulled from production and calibrated yearly, only the communications paths need to be routinely calibrated. Warehouses full of expensive instruments do not have to be stored, transported, integrated into equally expensive racks. Logistics overhead to merely obtain and support the equipment is reduced.

Implementation of an embodiment, or various combinations of embodiments of the present invention facilitates the production and testing of an electronic device. The process also provides for statistical monitoring of the Device Under Test (DUT).

A more complete appreciation of the present invention and the scope thereof can be obtained from the accompanying drawing which are briefly summarized below, the following detailed description of the presently-preferred embodiment of the invention, and the appended claims.

DETAILED DESCRIPTION

A novel apparatus and method for the production and testing of an electronic device is provided. The invention verifies processes at the point of operation and identifies problems early to save production yield, time and other resources.

Figure 1A:
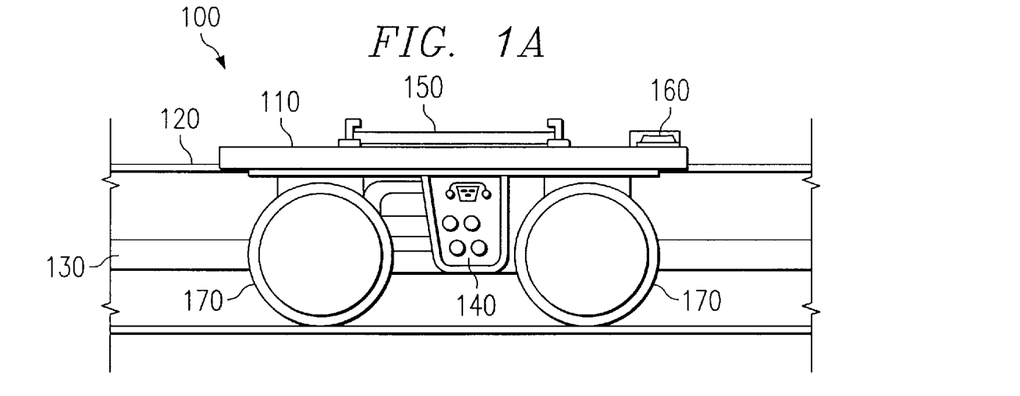
FIG. 1A shows a profile view of a Device Under Test (DUT) universal fixture in accordance with an embodiment of the present invention.
Figure 1B:
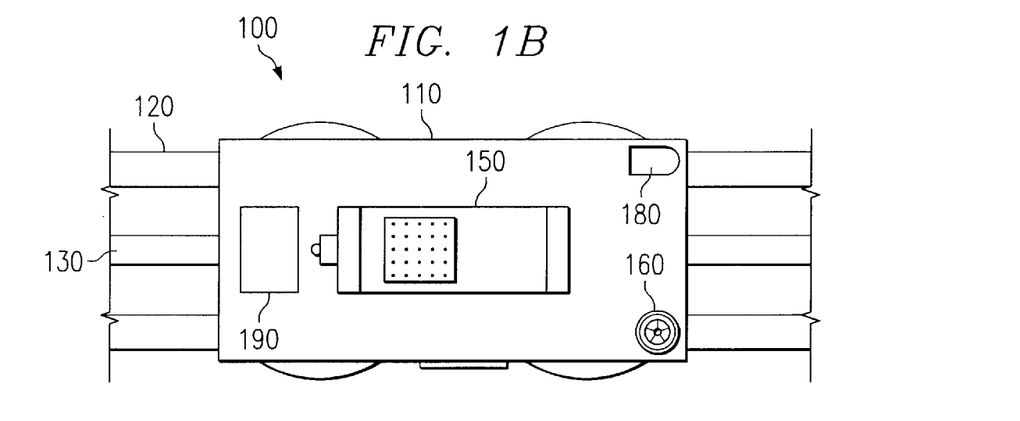
FIG. 1B shows an overhead view of a Device Under Test (DUT) universal fixture in accordance with an embodiment of the present invention.

FIG. 1 is comprised of FIGS. 1A and 1B. FIG. 1A shows a profile view the system 100 of a Device Under Test (DUT) universal fixture 110 riding on a powered track conveyor 120. FIG. 1B shows an overhead view of the same. Power may be provided by a central guide with a power source 130. DUT universal fixture 110 rides on powered track conveyor 120 on wheels 170. DUT fixture 110 further comprises diagnostics port 140, fixture adapter interface/mounting assembly 150, Radio Frequency (RF) galvanic socket 160, low power addressable RF transmit/receiver (TX/RX) 190.

Figure 2A:
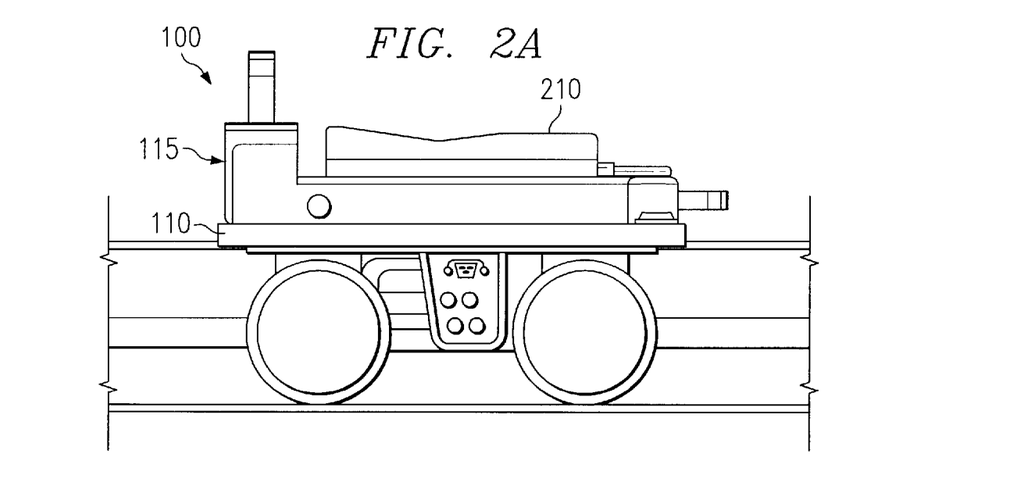
FIG. 2A shows a profile view of a Device Under Test (DUT) dedicated fixture adapter with a Device Under Test (DUT) engaged on fixture adapter and fixture adapter attached to the Device Under Test (DUT) universal fixture of FIGS. 1A and 1B.
Figure 2B:
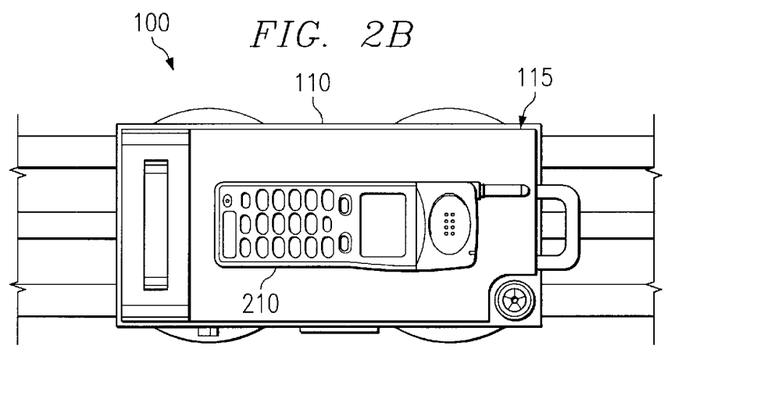
FIG. 2B shows an overhead view of a Device Under Test (DUT) dedicated fixture adapter with a Device Under Test (DUT) engaged on fixture adapter and fixture adapter attached to the Device Under Test (DUT) universal fixture of FIGS. 1A and 1B.

FIG. 2 is comprised of FIG. 2A and FIG. 2B. FIG. 2A is a profile view of a Device Under Test (DUT) dedicated fixture adapter 115 with a Device Under Test (DUT) 210 engaged on fixture adapter 115. Fixture adapter 115 is mounted on fixture adapter interface/mounting assembly 150. Fixture provides power, communications to master control system (MCS) and remote sensors. Fixture adapter 115 is modified to per product needs. This provides for a fixture 110 to be able to be used with a multitude of product configurations.

DUT enters the process as populated Printed Circuit Board (PCB). Application Specific Integrated Circuits (ASIC)s and other applicable components are boundary scanned. DUT is flashed software, and self-tests itself for solder connectivity and component presence. Passing all self-tests certifies that a populated PCB is a functionally sound and reliable Radio Module with high probability for successfully completing the assembly process and shipping.

The DUT is placed into a powered up state as soon as the Radio Module is fitted with a user interface (UI) and handset exterior. It remains powered throughout the rest of production process.

Production testing including Baseband and RF tuning/ alignment, software flashing, display and user interface testing, all occur in a distributed fashion. DUT physically moves on its fixture during the production process with a goal of never halting until either packed for shipping or out of the process as a failure. A "dummy" calibrator fixture is introduced into the process at regular intervals which verifies, makes correction or reports deviation in communication paths between a notional DUT and all points of inspection, measurement, or tuning. Assembly and component verification is tested at the point of assembly wherever possible.

To facilitate testing while in motion, communications between DUT, ATEs, and master control system (MCS) is performed wirelessly using a moving powered fixture and production adapter which physically interfaces DUT. All communication equipment, being specific to the process not the product, resides on board the universal fixtures 110. Control of multiple (1 to n) fixture/fixture adapter units is via the MCS computer addressing individual fixture/fixture adapter unit unique address. MCS directs each individual DUT through the process, recording process results and monitoring progress using microwave RF above the DUT RF operating range.

ATEs consist of small PXI bus chassis and integrated computer. These chassis support function cards effectively allow "virtual instruments". Size and cost are $\frac{1}{5}^{th}$ that of conventional ATE with no degradation in functionality.

Figure 3:
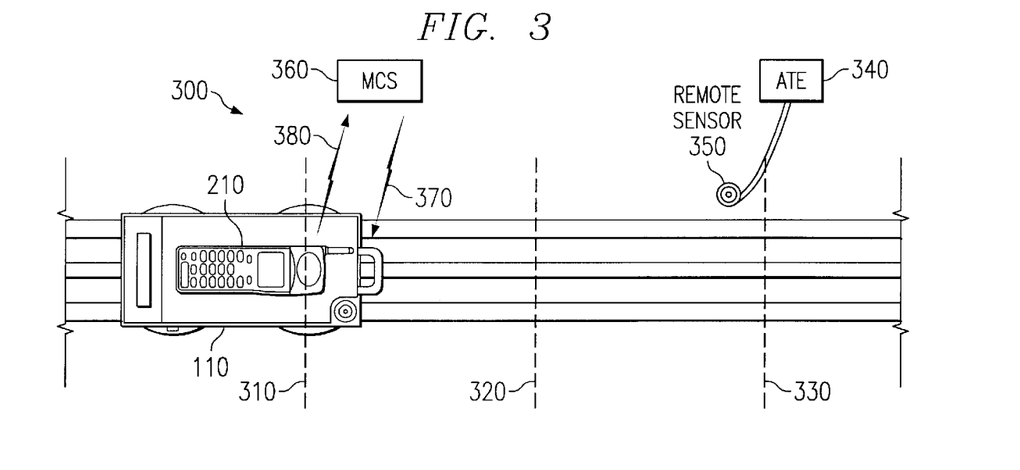
FIG. 3 shows the DUT approaching a test area.

Distributed testing occurs through short-range RF communication, such as BLUETOOTH, Ultra Wideband (UWB) and the like, between the DUT's fixture/fixture adapter unit and remote sensors connected to ATE. FIG. 3 is an illustration showing the DUT approaching a test area 300. The MOS 360 is in communication 370 and 380 with DUT universal fixture 110. In order to ensure maximum utilization of ATE instruments, fixture 110/fixture adapter 115 units signal approach of an impending test. As fixture 110/fixture adapter 115 unit crosses a designated phase line (ready line) 310, the MCS 360 directs 370 DUT 210 to place itself in a required state thereby ready when it enters the sensor's range. When it crosses into effective communication range (trigger line) 320 of remote sensors 350, selected measurements/actions are performed and transacted between DUT and ATE (through remote sensors 350) via BLUETOOTH or similar local wireless communication systems. Concurrently, results of the transaction are communicated 380 to MCS 360. At this point, the ATE begins testing the next immediate DUT as it comes into range, utilized nearly 100% of the time. The completed DUT remains in the "GO" state and continues advance, or changes to a "NO-GO" state and is directed into a parallel diagnostics and rework process. Measurement processes may cease when DUT passes a limit of advance line 330.

Assembly and installation process verification is monitored at the point of assembly by vision systems which confirm/deny presence and placement of components. Failures due to process instability are fixed onsite along with the affected process. Failures due to imperfect materials/ components are routed to quality control.

Certain aspects of RF/Baseband tuning, alignment, and measuring still require an unbroken calibrated galvanic connection with the DUT. These actions will occur concentrated in an RF shielded cell where a robotic arm/socket assembly will interface the moving fixture/fixture adapter, move with it for the duration of measurements, and extract when complete.

Figure 4:
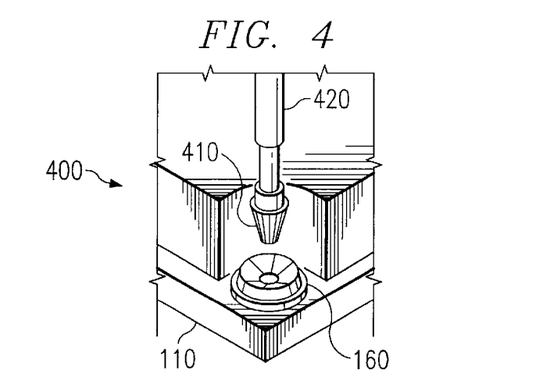
FIG. 4 shows a system inside cell for wired coupled communication with DUT through the universal fixture.

FIG. 4 is a illustration showing a system 400 inside cell for wired coupled communication with DUT through the universal fixture. Robotic telescoping arm 420 extends jack 410 to be receivable contact with Radio Frequency (RF) galvanic socket 160 of universal fixture 110.

Figure 5:
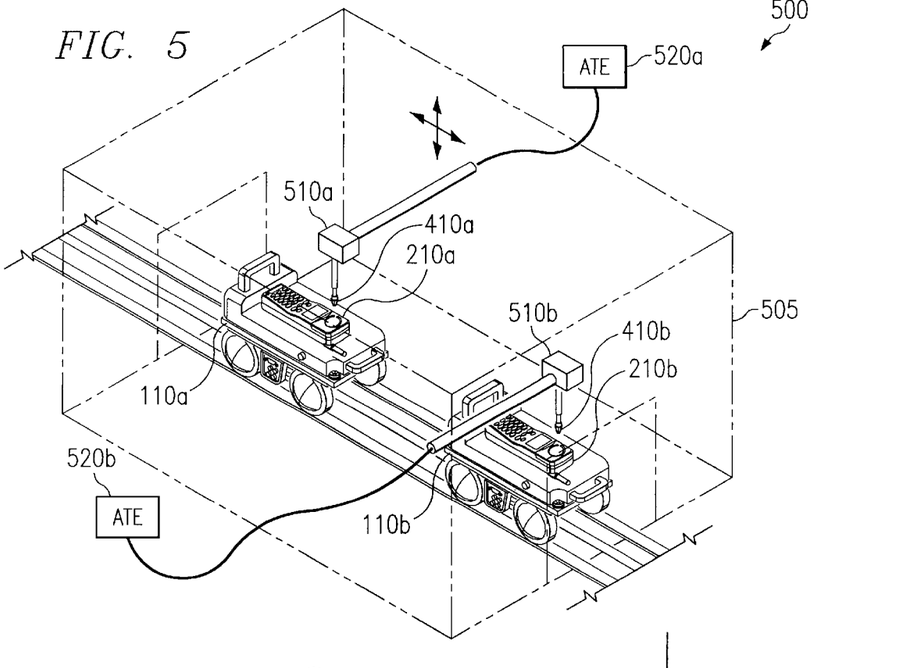
FIG. 5 shows a system for testing in a RF shielded cell.

FIG. 5 is an illustration of a system 500 for testing in a RF shielded cell. In unison, a DUT 210a enters the cell 505 riding on universal fixture 110a, a robot 510a interfaces the DUT 210a, DUT 210b which is one preceding DUT 210a is disengaged from a robot 510b, and the preceding DUT 210b and fixture 110b exit the cell. The RF paths are calibrated from DUT to socket on the fixture 110/fixture adapter 115, and from Jacks 410a and 410b to ATE 520a and 520b in the robot arm/cell. The targeted testing will be dramatically shorter than current testing because the conditions for measuring (powering up, going to a specified state or channel, etc.) will be established by the DUT before it enters the cell.

Once all standards are met, the DUT is certified a functionally sound and reliable RF handset, issued an electronic serial number (ESN) and powers down, all physical interfaces to the fixture adapter disengage. The handset routes to an off-loading and packaging cell where it is extracted from the fixture adapter, laser "branded", packaged and shipped.

Figure 6:
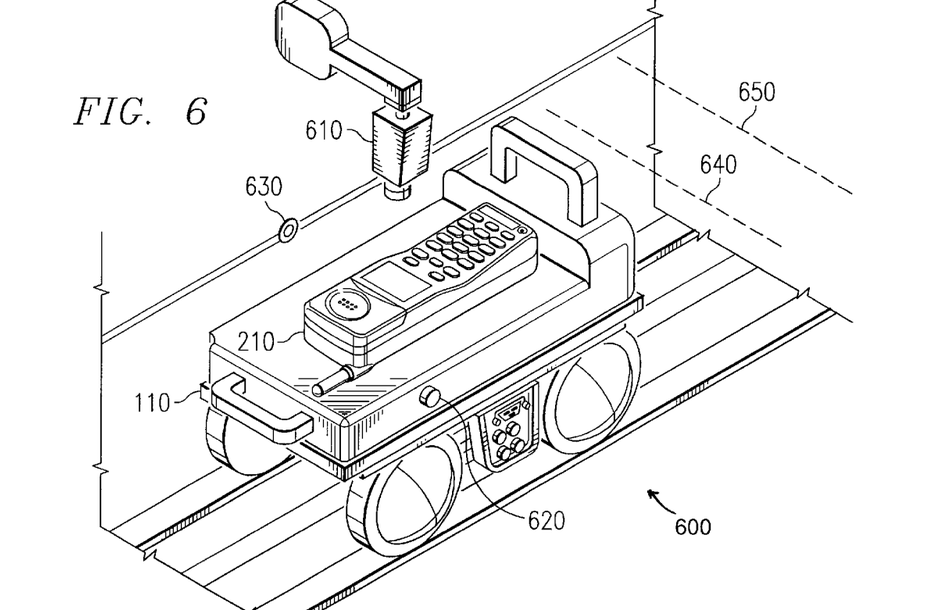
FIG. 6 show an optical inspection system.

Inspection of the completed handset may be done by an system such as is shown in FIG. 6. Optical inspection system 600 comprising a optical image capture device 610, IR fiducial sensor 630, IR fiducial emitter 620. Optical image capture device 610 may be camera, Charge Coupled Device (CCD) or the like. Optical image capture device 610 may be moveable to allow for inspection control. Optical image capture device 610 may also be fixed and images DUT as it travels below said optical image capture device 610. The optical image capture device is activated when DUT on fixture passes pass a trigger line 640. There may also be ready line 650 wherein DUT and fixture pauses until the inspection area is ready to receive a new electronic device which is to be tested. The optical image capture device replaces an electro-solenoid key press unit allows for user interface verification with time wasting pneumatic key press robots.

Figure 7:
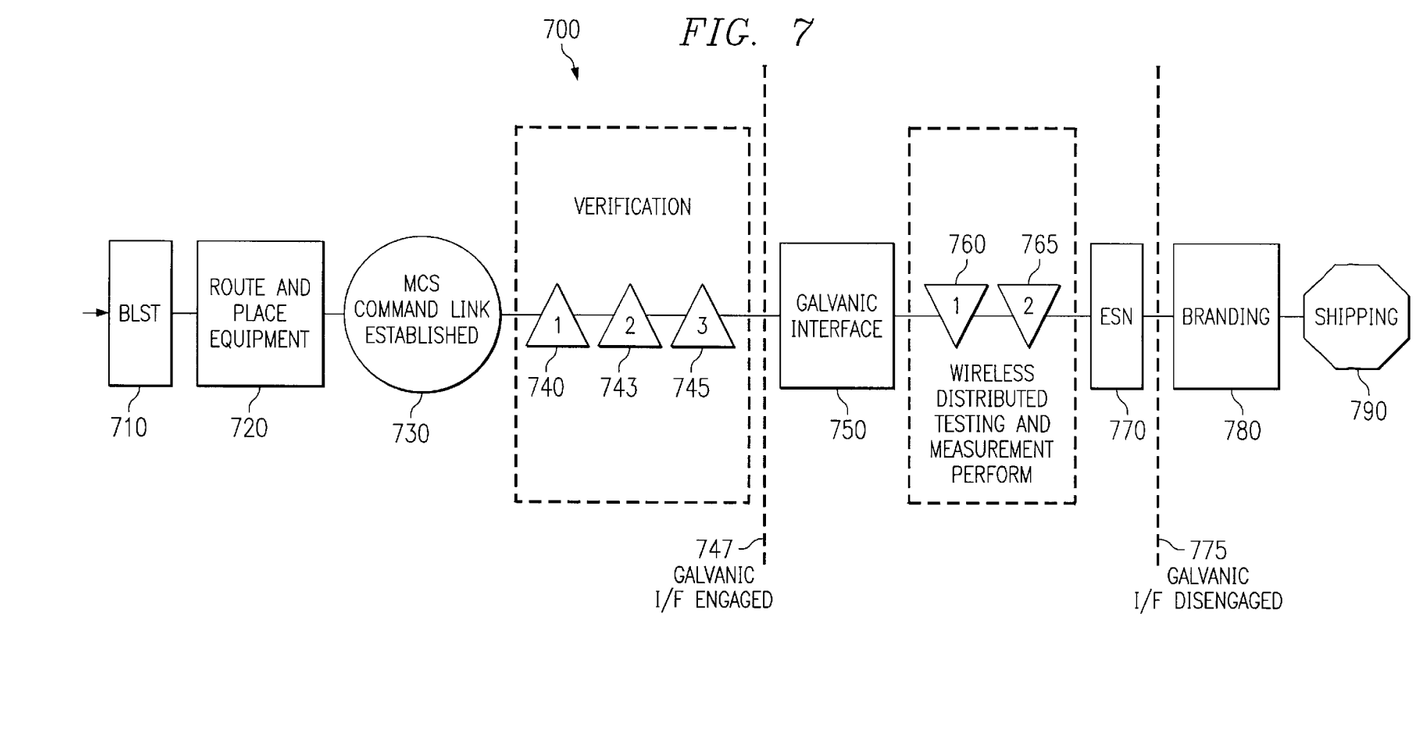
FIG. 7 shows an exemplar production/text line.

FIG. 7 is a block diagram representing a production/test line showing the various stations on the line in accordance with an embodiment of the present invention. At 710, multi-panel flash and built-in self-test (BLST) is done. Next at 720 route and place equipment place the PCB in electronic device chassis. At this point, an MCS command link is established with the fixture.

740, 743, 745 may be different verification areas. Verification tools and techniques in these areas may include, inter alia, camera verification of the assembly, User Interface module and display, keypad tests may also be perform at one of these stations.

At the line 747, the Device Under Test is engaged to go through 750, 760, 765 and 770. At 750, galvanic interface as was described above in discussion of FIGS. 4 and 5. The testing in this area depends upon what type of electronic device is under test. To use a mobile station for example, tests included in this area may include baseband tuning, alignment and verification. Radio Frequency tuning and FCC certification may also be performed in these areas. Additionally, if applicable, the electronic device is also provided with an Electronic Serial Number (ESN). At points 760 and 765, wireless distributed testing and measurements are performed. Voltage levels are measured. If applicable, the audio of the device is checked. Input/output presence and certification are performed at points 760 or 765. The DUT is disengaged at line 775 and proceeds to the next area.

At point 780, laser branding may be performed and/or physcial labels may be attached to the electronic device. Then the electronic device is packed and made ready for shipping at 790.

Artificial Intelligence decision support systems monitor yields and production trends. This automates the monitoring process at near real-time. For example, updates may occur once every 5 minutes.

Yield and process statistics are monitored near real-time by an Artificial Intelligence (AI) package, which incorporates the associative knowledge of Artificial Neural Nets (ANN) with the cognitive rule-based behavior of an Expert System (ES). The AI identifies patterns or trends and reacts according to established rule-sets governing process situations. Reactions range from notification of human authorities to alarms and even process alteration. All facets of this process need to be divided into sub-projects.

An example of such an Al system is provided by co-pending application U.S. patent application Ser. No. 09/923,215 filed on Aug. 6, 2001, entitled PRODUCTION PATTERN RECOGNITION ARTIFICIAL NEURAL NET WITH EVENT-REPONSE EXPERT SYSTEM. Said application is assigned to assignee of present invention and is incorporated herein by reference.

Abbreviations

AI—Artificial Intelligence.

ATE—Automated Test Equipment. A chassis populated with instruments, controlled by a computer, which controls various measurements and tests on a DUT, and records results.

ANN—Artificial Neural Network: a computer model composed of a large number of interconnected, interacting, processing elements organized into layers. Mimics behavior of human nervous system at the neuronic level. ANN reasoning is associative in nature.

DUT—Device Under Test: May be any electrical device which is undergoing production and/or testing. In the preferred embodiment, the production of a PCB, radio module, or mobile station depending on the point of assembly.

ES—Expert System: A problem solving and decision making system based on knowledge of its task and logical rules and procedures for using the knowledge. Knowledge and logic are codified from the experience of human specialists in the field. ES reasoning is cognitive and rule-based in nature.

ESN—Electronic Serial Number.

MCS—master control system.

These and other features, aspects, and advantages of embodiments of the present invention will become apparent with reference to the following description in conjunction with the accompanying drawings. It is to be understood, however, that the drawings are designed solely for the purposes of illustration and not as a definition of the limits of the invention, for which reference should be made to the appended claims. The word "a" and "an" may mean one or more.

What is claimed is:

1. An apparatus for handling an electronic device under test, comprising:
   a platform to mount said electronic device;
   a power supply;
   means coupled to said power supply for said motorized transport of said apparatus on a track and to power said electronic device while said electronic device is being tested; and
   a low power addressable RE transmit/receiver to provide a wireless interface to the apparatus and the electronic device under test.

2. The apparatus as set forth in claim 1, further comprising:
   a removable adapter interface/mounting assembly to provide for universal mounting of electronic device on a conductive interface to the electronic device; and
   a galvanic socket to provide a conductive path from a piece of test equipment to said electronic device.

3. The apparatus as set forth in claims 1 or 2, further comprising:
   a diagnostics port to provide status of said apparatus and to configure said apparatus.

4. The apparatus as set forth in claims 1 or 2 wherein said power supply is provide by a power rail coupled to said track.

5. The apparatus as set forth in claims 1 or 2 wherein said power supply is a battery pack.

6. A method for distributive testing of an electronic device mounted on a moving handling system using short range communication, said method comprising the steps of:
   signaling approach of an impending test by having movable handling system in communication of a master control system;
   directing said electronic device to place itself in a required state thereby ready to receive a plurality wireless testing signals from at least one of a plurality of short range communication devices when said electronic device enters said at least one of a plurality of short range communication devices range; and
   performing a selected series of actions after said electronic device crosses into effective communication range said at least one of said plurality of short range communication devices.

7. The method of claim 6, further comprising the step of monitoring by a means for inspection which confirm/deny presence and placement of a plurality of components.

8. The method of claim 6 wherein said actions are performed in an RF shielded cell further comprising the step of:
   inserting a male jack of a robotic arm in a receivable radio frequency galvanic socket on said moving handling system, wherein said male jack and said robotic arm provide an unbroken calibrated galvanic connection with said electronic device;
   interfacing said moving handling system with test equipment via said unbroken calibrated galvanic connection with said electronic device via said male jack and said robotic arm wherein said robotic arm moves with said moving handling system; and
   extraction of said jack of said robotic when said actions are completed.

9. An power delivering fixture to transport a mobile station during testing, comprising:
   a platform to mount said mobile station;

a power supply to provide power to said power delivering fixture and said mobile station during testing;

means coupled to said power supply for said motorized transport of said power delivering fixture on a track; and a low power addressable RF transmit/receiver to provide a wireless interface to said power delivering fixture and said mobile station during testing.

10. The power delivering fixture as set forth in claim 9, further comprising:

a removable adapter interface/mounting assembly to provide for universal mounting of said mobile station on a conductive interface to said mobile station; and a galvanic socket to provide a conductive path from a piece of test equipment to said mobile station.

11. The power delivering fixture as set forth in claims 9 or 10, further comprising:

a diagnostics port to provide status of said power delivering fixture and to configure said power delivering fixture.

12. The power delivering fixture as set forth in claims 9 or 10 wherein said power supply is provide by a power rail coupled to said track.

13. The power delivering fixture as set forth in claims 9 or 10 wherein said power supply is a battery pack.

* * * * *

UNITED STATES PATENT AND TRADEMARK OFFICE
CERTIFICATE OF CORRECTION

PATENT NO. : 6,563,301 B2  
APPLICATION NO. : 09/845912  
DATED : May 13, 2003  
INVENTOR(S) : Gventer It is certified that error appears in the above-identified patent and that said Letters Patent is hereby corrected as shown below:

Column 8, line 10, "addressable RE transmit/receiver" should read --addressable RF transmit/receiver--.

Signed and Sealed this

Seventh Day of November, 2006

JON W. DUDAS  
*Director of the United States Patent and Trademark Office*